(12) United States Patent
Rathor et al.

(10) Patent No.: US 8,093,680 B1
(45) Date of Patent: Jan. 10, 2012

(54) METAL-INSULATOR-METAL-INSULATOR-METAL (MIMIM) MEMORY DEVICE

(75) Inventors: Manuj Rathor, Milpitas, CA (US); Suzette K. Pangrle, Cupertino, CA (US); Steven Avanzino, Cupertino, CA (US); Zhida Lan, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 138 days.

(21) Appl. No.: 11/521,219

(22) Filed: Sep. 14, 2006

(51) Int. Cl.
*H01L 29/68* (2006.01)
(52) U.S. Cl. ...... 257/529; 257/30; 257/324; 257/E29.17
(58) Field of Classification Search .................. 257/212, 257/303, 529, 530, 30, 324, E29.17
See application file for complete search history.

(56) References Cited

U.S. PATENT DOCUMENTS

| | | | | |
|---|---|---|---|---|
| 6,259,128 B1* | 7/2001 | Adler et al. | ..................... | 257/301 |
| 6,307,730 B1* | 10/2001 | Yamanishi | ..................... | 361/303 |
| 6,459,562 B1* | 10/2002 | KarRoy et al. | ................. | 361/312 |
| 2002/0146887 A1* | 10/2002 | Liu et al. | ........................ | 438/300 |
| 2004/0100817 A1* | 5/2004 | Subramanian et al. | ........ | 365/158 |
| 2004/0169992 A1* | 9/2004 | Hunt et al. | ..................... | 361/311 |
| 2006/0194438 A1* | 8/2006 | Rao et al. | ....................... | 438/720 |

OTHER PUBLICATIONS

Iovan et al. "Blocking and memory functionalities using metal/oxide multilayer systems," Materials Science and Engineering B, vol. 126 pp. 258-261, Jan. 2006.*

* cited by examiner

*Primary Examiner* — Anh Phung
*Assistant Examiner* — Allison P Bernstein

(57) ABSTRACT

The present memory device includes first and second electrodes, first and second insulating layers between the electrodes, the first insulating layer being in contact with the first electrode, the second insulating layer being in contact with the second electrode, and a metal layer between the first and second insulating layers. Further included may be a first oxide layer between and in contact with the first insulating layer and the metal layer, and a second oxide layer between and in contact with the second insulating layer and the metal layer.

15 Claims, 4 Drawing Sheets

METAL-INSULATOR-METAL-INSULATOR-METAL (MIMIM) MEMORY DEVICE

BACKGROUND OF THE INVENTION

1. Technical Field

This invention relates generally to electronic devices; and more particularly, to resistive memory devices.

2. Background Art

FIG. 1 illustrates a two-terminal metal-insulator-metal (MIM) resistive memory device 30. The memory device 30 includes a metal, for example copper electrode 32, an active layer 34 of for example copper oxide on and in contact with the electrode 32, and a metal, for example copper electrode 36 on and in contact with the active layer 34. As an example of the operational characteristics of such a device 30, with reference to FIG. 2, initially, assuming that the memory device 30 is unprogrammed, in order to program the memory device 30, ground is applied to the electrode 32, while a positive voltage is applied to electrode 36, so that an electrical potential $V_{pg}$ (the "programming" electrical potential) is applied across the memory device 30 from a higher to a lower electrical potential in the direction from electrode 36 to electrode 32. Upon removal of such potential the memory device 30 remains in a conductive or low-resistance state having an ON-state resistance.

In the read step of the memory device 30 in its programmed (conductive) state, an electrical potential $V_r$ (the "read" electrical potential) is applied across the memory device 30 from a higher to a lower electrical potential in the direction from electrode 36 to electrode 32. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device 30, a positive voltage is applied to the electrode 32, while the electrode 36 is held at ground, so that an electrical potential $V_{er}$ (the "erase" electrical potential) is applied across the memory device 30 from a higher to a lower electrical potential in the direction of from electrode 32 to electrode 36. (The programming and erasing described above are provided as an example. As another example, the program and erase operations may employ the same bias polarity).

In the read step of the memory device 30 in its erased (substantially non-conductive) state, the electrical potential $V_r$ is again applied across the memory device 30 from a higher to a lower electrical potential in the direction from electrode 36 to electrode 32 as described above. With the active layer 34 (and memory device 30) in a high-resistance or substantially non-conductive OFF state, the memory device 30 will not conduct significant current, which indicates that the memory device 30 is in its erased state.

It will be understood that a memory device of this general type should be capable of use in a variety of conditions. For example, different device programming and erasing thresholds may be needed in different applications. Meanwhile, such a memory device should have rapid switching speed and show high stability in its programmed and erased states.

Therefore, what is needed is an approach wherein a memory device of the general type described above may be readily configured so as to be usable in a variety of conditions, meanwhile exhibiting rapid switching speed and high data storage stability.

DISCLOSURE OF THE INVENTION

Broadly stated, the present memory device comprises first and second electrodes, first and second insulating layers between the electrodes, and a metal layer between the first and second insulating layers.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of a illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Figure 1:
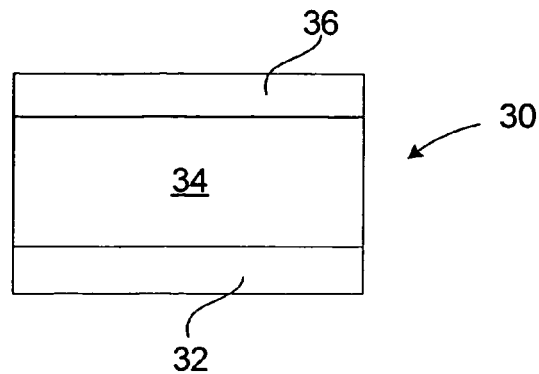
FIG. 1 is a cross-sectional view of an above-described Background Art memory device.
Figure 2:
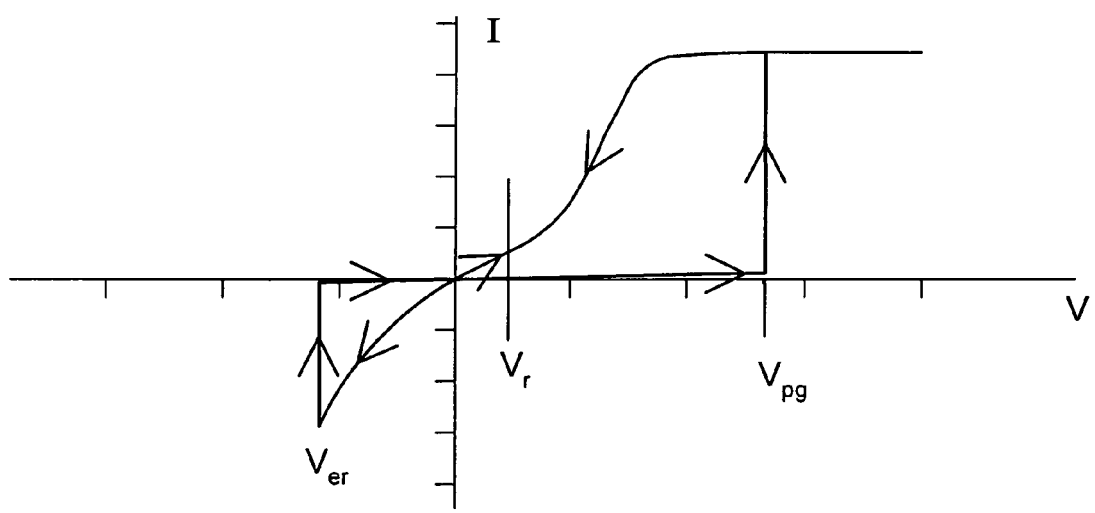
FIG. 2 is a plot of current vs. voltage illustrating operating characteristics of the memory device of FIG. 1.
Figure 3:
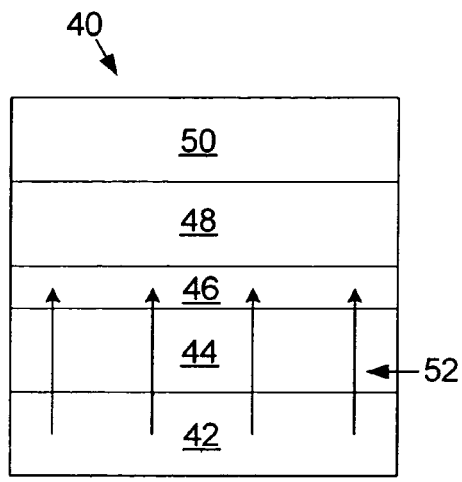
FIGS. 3 and 4 show a first embodiment of the invention, illustrating a first approach for programming and erasing thereof.
Figure 4:
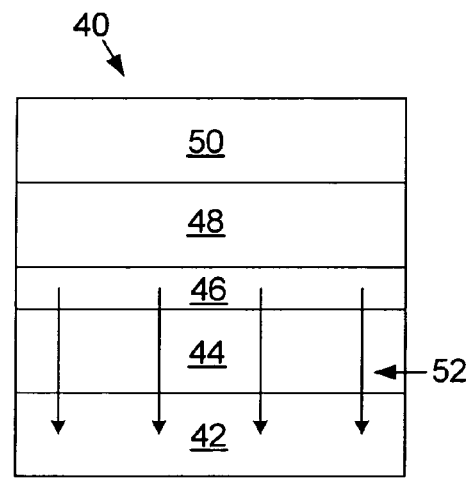

FIGS. 3 and 4 illustrate a first embodiment of the invention. As shown therein, the resistive memory device 40 includes an electrode 42, which may be deposited on a substrate (not shown) and which may be for example Ta, TaN, TiN, WN, Ta/TaN, Ti/TiN, or W/WN. The electrode 42 may be for example, 200-500 angstroms thick. Deposited on and in contact with the electrode 42 is an insulating layer 44 of for example $SiO_x$, $Si_xN_y$, $TiO_x$, $Al_xO_y$, $Ta_xO_y$, $Hf_xO_y$, or $Zr_xO_y$, where x and y represent the possibility of non-stoichiometry of the oxide. Alternatively, the insulating layer 44 may be thermally grown from a metal layer deposited on the electrode 42. The insulating layer 44 may be for example 50-150 angstroms thick. Deposited on and in contact with the insulating layer 44 is a metal, e.g., copper layer 46. This metal layer 46 may take the form of a thin continuous sheet or may take the form of metal nanocrystals. This metal layer 46 may be for example 20-50 angstroms thick. Another insulating layer 48 of for example $SiO_x$, $Si_xN_y$, $TiO_x$, $Al_xO_y$, $Ta_xO_y$, $Hf_xO_y$ or $Zr_xO_y$, is deposited on and in contact with the metal layer 46. Alternatively, the insulating layer 48 may be thermally grown from a metal layer deposited on the metal layer 46. This insulating layer 48 may be for example 50-150 angtroms thick. The metal layer 46 is chosen such that it does not reduce the adjacent insulating layers 44 and 48. Deposited on and in contact with this insulating layer is an electrode 50 of for example Ta, TaN, TiN, WN, Ta/TaN, Ti/TiN, or W/WN. This electrode 50 may be for example, 200-500 angstroms thick. It will be seen that the insulating layers 44, 48 are between the electrodes 42, 50, and the metal layer 46 is between the insulating layers 44, 48. The metal layer 46 is thus buried within an insulating matrix made up of insulating layers 44, 48. It will be seen that a Metal-Insulator-Metal-Insulator-Metal (MIMIM) device is described and illustrated.

A first approach to programming and erasing the memory device 40 is shown in FIGS. 3 and 4. As shown in FIG. 3, an electrical potential is applied across the electrodes 50 and 42, from higher to lower potential in the direction from the electrode 50 to the electrode 42. This causes, in this example, negative charge carriers, i.e., electrons illustrated by the arrows 52, to move from the electrode 42 into and through the insulating layer 44. The charge carriers are trapped in a potential well formed by the metal layer 46, or in the metal layer and in traps formed in the insulating layer near the interface of the insulating layer with the metal layer. This charge trapping alters the potential across the two insulating layers and yields a first memory state. The filling of the traps in the insulating layer will result in a switch to a low resistance (programmed) state based on the Space Charge Limited Conduction (SCLC) model.

With reference to FIG. 4, an electrical potential is applied across the electrodes 50 and 42, from higher to lower potential in the direction from the electrode 42 to the electrode 50. This causes the trapped charge carriers (electrons) to move from the metal layer 46 into and through the insulating layer 44, tunneling through the insulating layer 44 to the electrode 42, causing the memory device 40 to be in a second, alternate state. If the trapped carriers had also resided in the insulating layer traps near the insulating layer-metal layer interface, completely filling or substantially filling those traps, a high resistance (erased) state will now result, based on the SCLC model.

Figure 5:
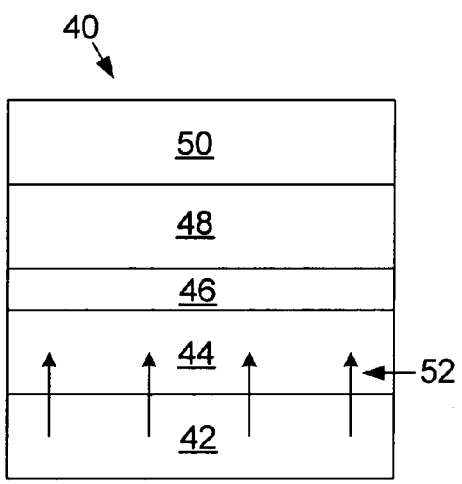
FIGS. 5 and 6 show the first embodiment of the invention, illustrating a second approach for programming and erasing thereof.
Figure 6:
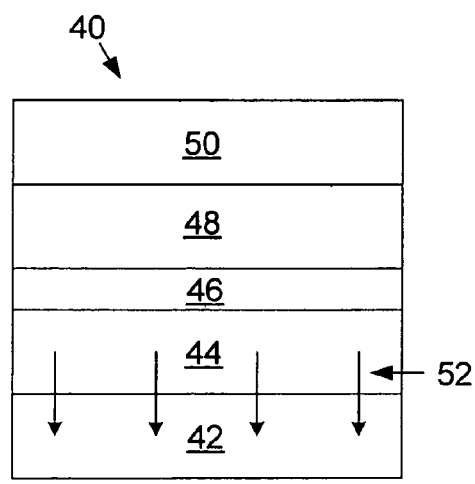

A second approach to programming and erasing the memory device 40 is shown in FIGS. 5 and 6. As shown in FIG. 5, an electrical potential is applied across the electrodes 50 and 42, from higher to lower potential in the direction from the electrode 50 to the electrode 42. This causes, in this example, negative charge carriers (electrons) illustrated by the arrows 52, to move from the electrode 42 into the insulating layer 44 and to be trapped by the insulating layer 44. The presence of the metal layer 46 modifies the trap distribution in the insulating layer 44 near its interface with the metal layer 46. The filling of the traps in the insulating layer results in a switch to a low-resistance (programmed) based on the SCLC model.

With reference to FIG. 6, an electrical potential is applied across the electrodes 50 and 42, from higher to lower potential in the direction from the electrode 42 to the electrode 50. This causes the trapped charge carriers to move from the insulating layer 44 into the electrode 42, causing the memory device 40 to be in a high-resistance (erased) state. In this approach, the insulating layer 44 is itself a switching layer.

The programming step can be a combination of these programming mechanisms, i.e., with some of the charge carriers being trapped in the bulk of the insulating layer 44 and with other charge carriers tunneling through the insulating layer 44 to be trapped at the interface of the metal layer 46 and the insulating layer 44, and/or in the potential well formed by the metal layer 46. In this mechanism, charge carriers may initially move into the insulating layer 44 to substantially fill the bulk and the interface traps therein, and then additional charge carriers may be trapped in the metal layer 46.

Figure 11:
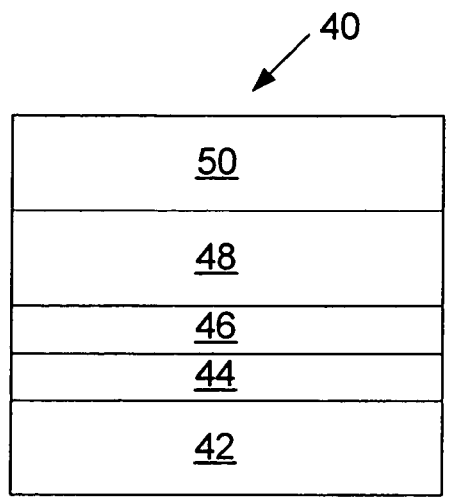
FIGS. 11 and 12 illustrate other embodiments of the present memory devices.

The programming and erasing characteristics of the device 40 may be selected by selecting physical characteristics thereof. For example, the insulating layers 44, 48 may be of the same or different types, and may be the same or different thicknesses. The metal layer 46 may be of different types and thicknesses. Additionally, the electrodes 42, 50 may be of the same or different types, and may be of the same or different thickness. FIG. 11 illustrates this approach.

Figure 7:
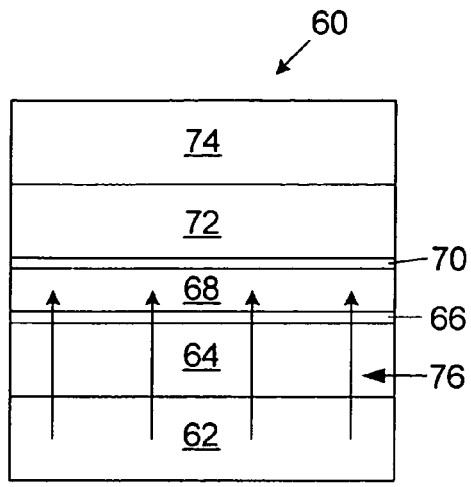
FIGS. 7 and 8 show a second embodiment of the invention, illustrating a first approach for programming and erasing thereof.
Figure 8:
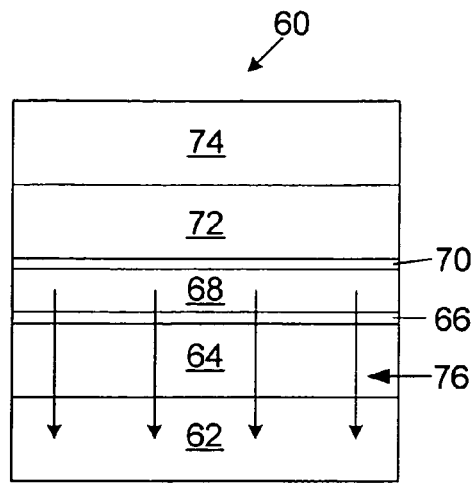

FIGS. 7 and 8 illustrate a second embodiment of the invention. As shown therein, the resistive memory device 60 includes an electrode 62, which may be deposited on a substrate (not shown) and which may be for example Ta, TaN, TiN, WN, Ta/TaN, Ti/TiN, or W/WN. The electrode 62 may be for example 200-500 angstroms thick. Deposited on and in contact with the electrode 62 is an insulating layer 64 of for example $SiO_x$, $Si_xN_y$, $TiO_x$, $Al_xO_y$, $Ta_xO_y$, $Hf_xO_y$ or $Zr_xO_y$, where x and y represent the possibility of non-stoichiometry of the oxide. Alternatively, the insulating layer 64 may be thermally grown from a metal layer deposited on the electrode 62. The insulating layer may be for example 50-150 angstroms thick. Deposited on and in contact with the insulating layer is a thin oxide layer 66, an oxide of the metal layer 68 to be deposited thereon (in this embodiment, with the metal layer 68 of copper, copper oxide for the thin oxide layer 66). Deposited on and in contact with the oxide layer 66 is a metal, i.e. copper layer 68. This metal layer 68 may take the form of a thin continuous sheet or may take the form of metal nanocrystals. This metal layer 68 may be for example 20-50 angstroms thick. Deposited on and in contact with the metal layer 68 is a thin copper oxide layer 70. Another insulating layer 72 of for example $SiO_x$, $Si_xN_y$, $TiO_x$, $Al_xO_y$, $Ta_xO_y$, $Ta_xO_y$, $Hf_xO_y$ or $Zr_xO_y$, is deposited on and in contact with the oxide layer 70. This insulating layer 72 may be for example 50-150 angstroms thick. Deposited on and in contact with this insulating layer 72 is an electrode 74 of for example Ta, TaN, TiN, WN, Ta/TaN, Ti/TiN, or W/WN. This electrode 74 may be for example, 200-500 angstroms thick. It will be seen that the insulating layers 64, 72 are between the electrodes 62, 74, and the metal layer 68 is between the insulating layers 64, 72, with the oxide layer 66 between the metal layer 68 and insulating layer 64, and the oxide layer 70 between the metal layer 68 and insulating layer 72.

A first approach to programming and erasing the memory device 60 is shown in FIGS. 7 and 8. As shown in FIG. 7, an electrical potential is applied across the electrodes 74 and 62, from higher to lower potential in the direction from the electrode 74 to the electrode 62. This causes in this example negative charge carriers (electrons) illustrated by the arrows 76 to enter the insulating layer 64 from the electrode 62 and tunnel through to enter and be trapped by the oxide layer 66. This causes the memory device 60 to be in low-resistance (programmed) state. This electrical potential may also cause charge carriers tunneling through the insulating layer 64 and entering the oxide layer 66 to substantially fill the traps in the oxide layer 66, after which additional charge carriers tunneling through the insulating layer 64 are trapped by the metal layer 68 near the interface of the metal layer 68 and oxide layer 66, a variation in the programming approach.

With reference to FIG. 8, an electrical potential is applied across the electrodes 74 and 62, from higher to lower potential in the direction from the electrode 62 to the electrode 74. This causes the trapped charge carriers to tunnel through the oxide layer 66 and the insulating layer 64 into the electrode 62, causing the memory device 60 to be in a high-resistance (erased) state.

Figure 9:
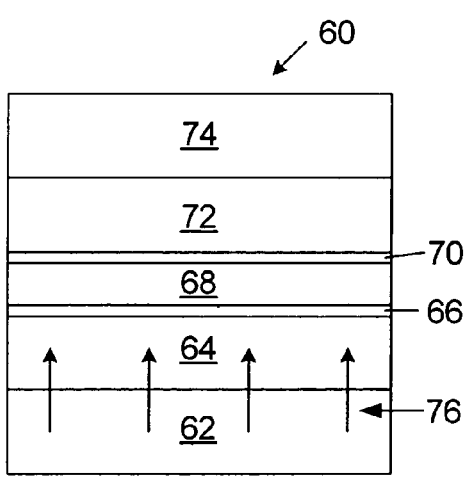
FIGS. 9 and 10 show the second embodiment of the invention, illustrating a second approach for programming and erasing thereof.
Figure 10:
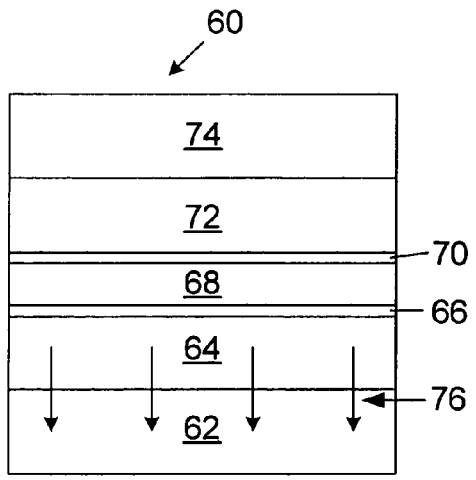

A second approach to programming and erasing the memory device 60 is shown in FIGS. 9 and 10. As shown in FIG. 9, an electrical potential is applied across the electrodes 74 and 62, from higher to lower potential in the direction from the electrode 74 to the electrode 62. This causes in this example negative charge carriers (electrons) illustrated by the arrows 76, to move from the electrode 62 into the insulating layer 64 and to be trapped by the insulating layer 64. The presence of the metal layer 68 modifies the trap distribution in the insulating layer 64 near the metal layer 68.

With reference to FIG. 10, an electrical potential is applied across the electrodes 74 and 62, from higher to lower potential in the direction from the electrode 62 to the electrode 74. This causes the trapped charge carriers to move from the insulating layer 64 into the electrode 62, causing the memory device 60 to be in a high-resistance (erased) state. In this approach, the insulating layer 64 is a switching layer.

Figure 12:
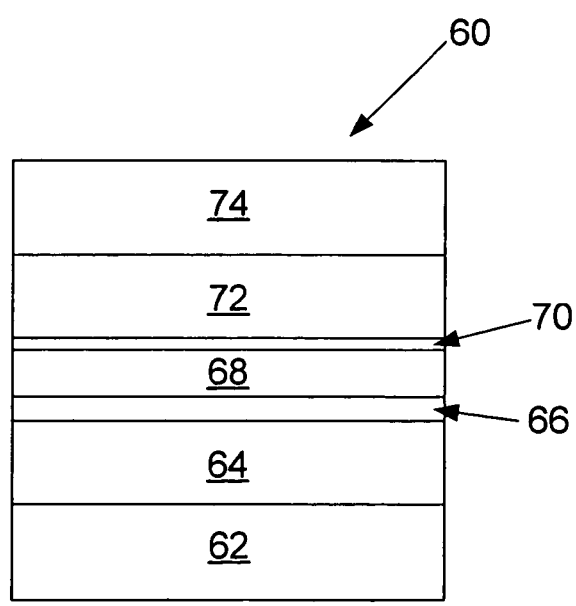

Again, programming and erasing characteristics of the device 60 may be selected by selecting physical characteristics thereof. For example, the insulating layers 64, 72 may be of the same or different types, and may be the same or different thicknesses. The metal layer 68 may be of different types and thicknesses. Additionally, the electrodes 62, 74 may be of the same or different types, and may be of the same or different thickness. Furthermore, the oxide layers 66, 70 may be of different types and thicknesses. FIG. 12 illustrates this approach.

It will be seen that the memory devices of both embodiments may be readily configured so as to be usable in a variety of conditions, Furthermore, such memory devices exhibit rapid switching speed and high data storage stability.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

The invention claimed is:

1. A resistive memory device capable of adopting different resistive states to determine different memory states comprising:
   first and second electrodes;
   first and second insulating layers between the first and second electrodes at opposite endpoints of the resistive memory device wherein the first insulating layer contacts the bottom of the first electrode and the second insulating layer contacts the top of the second electrode;
   a single metal layer located between and contacting the first and second insulating layers; and
   an oxide layer between the single metal layer and the first insulating layer wherein the oxide layer is an oxide of the single metal layer in contact with the first insulating layer and wherein the first insulating layer and the second insulating layer are formed from different materials.

2. The resistive memory device of claim 1 wherein the metal layer is a continuous metal layer.

3. The resistive memory device of claim 1 wherein the metal layer is a nanocrystalline metal layer.

4. The resistive memory device of claim 1 wherein the first and second insulating layers are of different thickness.

5. The resistive memory device of claim 1 wherein the first and second insulating layers are of different materials.

6. The resistive memory device of claim 1 wherein the metal layer is a continuous metal layer.

7. The resistive memory device of claim 1 wherein the metal layer is a nanocrystalline metal layer.

8. The resistive memory device of claim 1 wherein the first and second insulating layers are of different thickness.

9. The resistive memory device of claim 1 wherein the first and second insulating layers are of different materials.

10. A memory device capable of adopting different resistive states to determine different memory states comprising:
    first and second electrodes at opposite endpoints of the memory device;
    first and second insulating layers between the first and second electrodes, the first insulating layer being in contact with the first electrode, the second insulating layer being in contact with the second electrode wherein the first insulating layer contacts the bottom of the first electrode and the second insulating layer contacts the top of the second electrode;
    a single metal layer located between and contacting the first and second insulating layers;
    a first oxide layer between and in contact with the first insulating layer and the single metal layer; and
    a second oxide layer between and in contact with the second insulating layer and the single metal layer wherein the first and second oxide layers are oxides of the single metal layer and wherein the first insulating layer and the second insulating layer are formed from different materials.

11. The memory device of claim 10 wherein the first and second oxide layers are oxides of the metal of the single metal layer.

12. The memory device of claim 10 wherein the single metal layer is a continuous metal layer.

13. The memory device of claim 10 wherein the single metal layer is a nanocrystalline metal layer.

14. The memory device of claim 10 wherein the first and second insulating layers are of different thickness.

15. The memory device of claim 10 wherein the first and second oxide layers are of different thickness.

* * * * *